United States Patent [19]

Seidel et al.

[11] 3,965,453

[45] June 22, 1976

[54] PIEZORESISTOR EFFECTS IN SEMICONDUCTOR RESISTORS

[75] Inventors: Thomas Edward Seidel, Berkeley Heights; Masakazu Shoji, Warren, both of N.J.

[73] Assignee: Bell Telephone Laboratories, Incorporated, Murray Hill, N.J.

[22] Filed: Dec. 27, 1974

[21] Appl. No.: 536,847

[52] U.S. Cl. .................................... 338/13; 338/2
[51] Int. Cl.² ........................................ H01C 7/00
[58] Field of Search ............................... 338/2–5, 338/13; 357/26; 73/88.5 SD

[56] References Cited
UNITED STATES PATENTS

| | | | |
|---|---|---|---|
| 3,277,698 | 10/1966 | Mason | 73/88.5 SD |
| 3,292,128 | 12/1966 | Hall | 338/2 |
| 3,314,035 | 4/1967 | Sanchez | 338/2 X |
| 3,378,648 | 4/1968 | Fenner | 338/2 X |
| 3,456,226 | 7/1969 | Vick | 338/2 |

*Primary Examiner*—C. L. Albritton
*Attorney, Agent, or Firm*—P. Abolins; L. C. Canepa

[57] ABSTRACT

In semiconductor integrated circuits, piezoresistance is recognized as a factor affecting production yield and circuit performance. Current flow in a circuit resistor is aligned with one of the <100> family of equivalent directions. When current is flowing along such a direction the change in resistance due to any combination of stress components is at a minimum. Additionally, variation of resistance due to stress and strain may be reduced by an increase of the total impurity concentration in a resistor.

7 Claims, 2 Drawing Figures

PIEZORESISTOR EFFECTS IN SEMICONDUCTOR RESISTORS

BACKGROUND OF THE INVENTION

This invention relates to semiconductor integrated circuits and, more particularly, to resistors in those circuits.

It is known that a stress or a strain can cause a resistance charge in a semiconductor material. This property is known as piezoresistance. It has been described in an article by C. S. Smith entitled "Piezoresistance Effect in Germanium and Silicon," Phys. Rev., Vol. 94, No. 1, Apr. 1, 1954, page 42. Throughout this discussion of this invention the terms stress and strain will be used interchangeably.

Advantage has been taken of the piezoresistive effect in stress and strain gauges and transducers. That is, measurements of the resistance change in a semiconductor material have been used to determine the stress or strain applied to that semiconductor material. Stress and strain gauges and transducers are described in, for example, U.S. Pat. No. 3,137,834 issued to W. G. Pfann on June 16, 1964.

Further, it is known to form piezoresistive strain gauges by forming a diffused region of one conductivity type in a semiconductor wafer of the opposite conductivity type. Still further, it is known that it is advantageous to form the region so the direction of current flow in the region is in a sensitive piezoresistive direction. That is, so there is an observable current change resulting from the resistance change due to stress. Such a strain gauge has been described in U.S. Pat. No. 3,266,303 issued to W. G. Pfann on Aug. 16, 1966.

Also, it is known that a problem in the semiconductor art is an imperfect yield during fabrication. In particular, it is known that predictable and proper functioning of circuits sensitive to resistance changes are often difficult to achieve. It would be desirable that the correct values of resistances in a circuit be produced and maintained.

However, it may be sufficient to comply with a less stringent requirement of maintaining the relative values of resistors in a circuit. For example, some linear integrated circuits are designed assuming that relative values rather than absolute values of resistors are maintained. Such circuits can include digital-to-analog converters and voltage regulators. In these cases, elimination of relative resistance changes during fabrication would result in improved yield during fabrication and a cost reduction.

An improvement in integrated circuits can take place by properly appreciating a phenomenon previously thought to be insignificant. Although piezoresistance has been understood, its relationship to the manufacturing process and to an advantageously reliable product has not been completely appreciated. In particular, the effect of piezoresistance on integrated circuits which are not directed toward the measurement of stress and strain has not been fully appreciated. The piezoresistive effect can be of lesser magnitude than such effects as purity of the semiconductor material, crystalline perfection of the semiconductor material, and the number and type of conductivity determining impurities. Typically, these latter effects are carefully taken into account when fabricating semiconductor integrated circuits. It would also be desirable to fully appreciate the significance of piezoresistance on integrated circuits.

Of course, it has been recognized that excessive strain and stress can do damage to an integrated circuit. For example, mechanical weaknesses produced by stresses or strains can result in circuit failure. Accordingly, some attempts have been made at avoiding stresses and strains. However, all significant stresses and strains cannot always be eliminated.

This invention recognizes that remaining stresses and strains can adversely affect production yield and circuit performance. That is, undesirable stressing can occur during packaging a semiconductor chip into a package and during use of the circuit package itself. For example, built-in stresses are produced when impurities are diffused into one side of a semiconductor wafer. Stresses are also produced when a semiconductor wafer is cut into individual chips. When an integrated circuit chip is bonded to a die, the chip can be stressed by mechanical and thermal forces at the interface. The die is usually used to provide mechanical support and a heat sink. A particularly significant effect is the stress induced by the thermal expansion mismatch of a chip and a package during temperature cycling.

A result of such stresses and strains can be improper functioning of the circuit. When a chip is exposed to a nonuniform stress, relative resistance values can be disturbed and hence the circuit behavior can be disturbed too. In addition to recognizing stress produced problems, this invention also provides a means of reducing yield loss when fabricating semiconductor integrated circuits and providing better controlled and more predictable resistance values which, in turn, improve circuit performance.

SUMMARY OF THE INVENTION

This invention recognizes that semiconductor integrated circuit performance is limited by resistance changes due to stress and strain effects. Further, this invention reduces the resistance changes due to stress and strain effects. The absolute change due to the piezoresistance effect is reduced. Also, the relative resistance change due to the piezoresistance effect of one resistor to another resistor is reduced.

This invention recognizes the importance of the crystallographic directionality and the impurity concentration of a resistor to reducing a piezoresistive change.

First, this invention recognizes that the relative alignment of the direction of current flow to the crystallographic orientation of a semiconductor circuit can be a particularly significant factor in circuit fabrication and operation. Accordingly, part of this invention is a recognition of the fact that a proper choice of such relative alignment can improve production yield and reduce cost. To this end, there is chosen an appropriate crystallographic orientation of the semiconductor wafer and a configuration of a resistor to provide an appropriate direction of current flow.

Second, this invention recognizes that the number of compensated donor and acceptor impurities in a resistor affect the piezoresistive change in the resistor. In accordance with this invention, the total impurity concentration of the resistor is chosen to be at an appropriately high value. However, the free carrier concentration, or the difference between the acceptor concentration and the donor concentration, can be relatively small so a rather high sheet resistance can be obtained. For p-type conductivity the resistor will have an acceptor concentration larger than the donor concentration. Analogously, for n-type conductivity the resistor will have a donor concentration larger than the acceptor concentration.

Briefly, strain-dependent resistance can be summarized as follows. First, without strain, a vector quantity representing the electric field, E, is equal to a scalar quantity representing resistivity, $\rho$, times a vector quantity representing current density, J. When strain exists, the scalar resistivity $\rho$, becomes a symmetric second rank tensor. It can be observed that certain components of the second rank tensor are much larger than other components. A practically important conclusion can be drawn from this. If the current direction deviates from the <100> family of crystallographic directions, then a large electric field component due to shear strain appears. A direction of current flow sensitive to stress or strain is unfavorable for a precision resistor. To reduce the change in the electric field, the current should flow along a <100> direction. This is a strong condition which specifies the relationship of the crystallographic orientation of the wafer and the orientation of current flow in the resistor. More generally, it may be concluded that the stress dependence is minimum when the current is flowing along a <100> direction. This conclusion is valid for any combination of stress components. The family of <100> directions includes: [100], [$\overline{1}$00], [010], [0$\overline{1}$0], [001] and [00$\overline{1}$].

Changes in the electric field, and therefore stress dependent resistance changes, can be further reduced by reducing the magnitudes of all the components of the second rank resistivity tensor. As the doping increases the piezoresistive effect decreases. For example, at a resistivity of 0.02 ohm centimeters in p-type silicon the magnitude of the piezoresistive effect in the <111> and <110> directions can be reduced by a factor of about three or four by using an increased concentration of compensated acceptor impurities instead of the concentration of acceptor impurities required to establish the resistivity of 0.02 ohm-centimeters.

DETAILED DESCRIPTION

Figure 1:
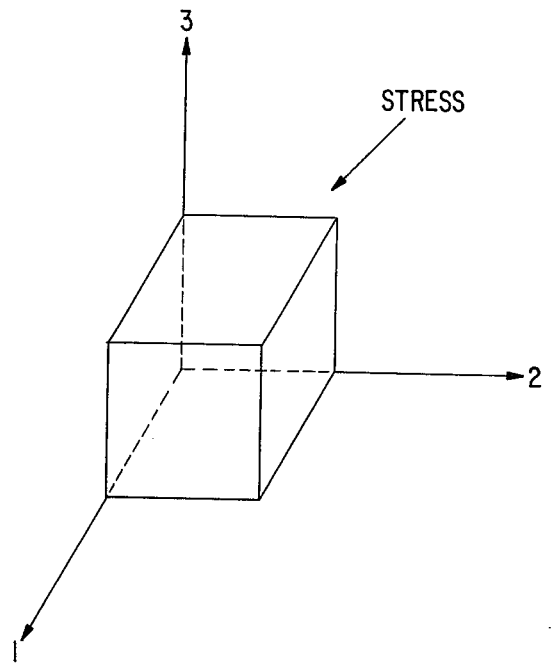
FIG. 1 shows a perspective view of a semiconductor wafer and its orientation with respect to a set of crystallographic axes.

FIG. 1 shows a semiconductor wafer with a crystallographic orientation aligned with a set of crystallographic directions, 1, 2, and 3. When such a semiconductor wafer is subjected to stress, the resistance of the wafer changes. Such a change due to stress or strain is termed piezoresistance. This is particularly noticeable in both n- and p-type germanium and p-type silicon material. Components of stress in different directions have different piezoresistive effects on current flowing in different directions. The doping of the material also has an effect on the piezoresistive effect.

The basic relationship $E = \rho J$, where E is the electric field vector, $\rho$ is the resistivity and J is the current density vector, has been described. Let us examine more specifically how the electric field changes when stress is applied. Since E is a vector, it may change by different amounts in different directions. As is known, the resistivity, $\rho$, in the presence of stress or strain can be expressed as a matrix of experimentally determined coefficients multiplied by a matrix expressing the stress or strain. Therefore, the resistivity can be expressed as a matrix resulting from the multiplication of these two matrices. The current density is a vector which can also be expressed as a single column matrix, which is a vector. Accordingly, the vector E can be expressed as the resultant matrix of the single column matrix representing the current density multiplied by the matrix representing the resistivity. It can be appreciated that the magnitudes of the experimentally determined coefficients and the various components of the stress and current determine the magnitude of the resultant electric field.

The experimentally determined coefficients take into account the particular material of the wafer and the crystallographic orientation of the wafer. These coefficients are not all of equal magnitude. For example, there can be a ten fold difference between the coefficients. In the cited article by Smith some of the coefficients given for p-type silicon are 0, 3.4, 11.2, and 110.0.

Accordingly, it is found that certain relationships of stress, current direction and crystallographic orientation produce a smaller change in the electric field than other relationships. That is, there is a smaller piezoresistive effect.

If the object is to adapt the integrated circuit to better withstand the effects of stress, the controllable variables include the current direction and the crystallographic orientation of the wafer. To reduce piezoresistance it has been found to be advantageous to have current flow along a direction in the <100> family of directions. A mathematical foundation for this conclusion is in a following appendix. Further, since in typical planar integrated circuits the current flow is parallel to a major surface of the wafer, there is a restriction placed on the crystallographic orientation of the semiconductor wafer. That is, a major surface of the semiconductor wafer should be parallel to one of the <100> family of directions. There are only two wafer orientations for planar integrated circuits in which the dominant term for stress produced change in the electric field disappears. One case is a (100) oriented wafer with current flowing in [010], [0$\overline{1}$0], [001], [00$\overline{1}$] directions. The other case is a (110) oriented wafer, with current flowing in [001] or [00$\overline{1}$] direction.

Therefore, in accordance with an embodiment of this invention, current flow is aligned with one of the <100> family of equivalent crystallographic directions. Such an alignment minimizes the piezoresistive effects of stress in any direction. It can be appreciated from FIG. 1 that a resistor having two ohmic contacts connected by a straight line parallel to one of the <100> directions, for example, represented by one of the axes 1, 2 or 3, can produce such a current flow resulting in minimum stress.

Figure 2:
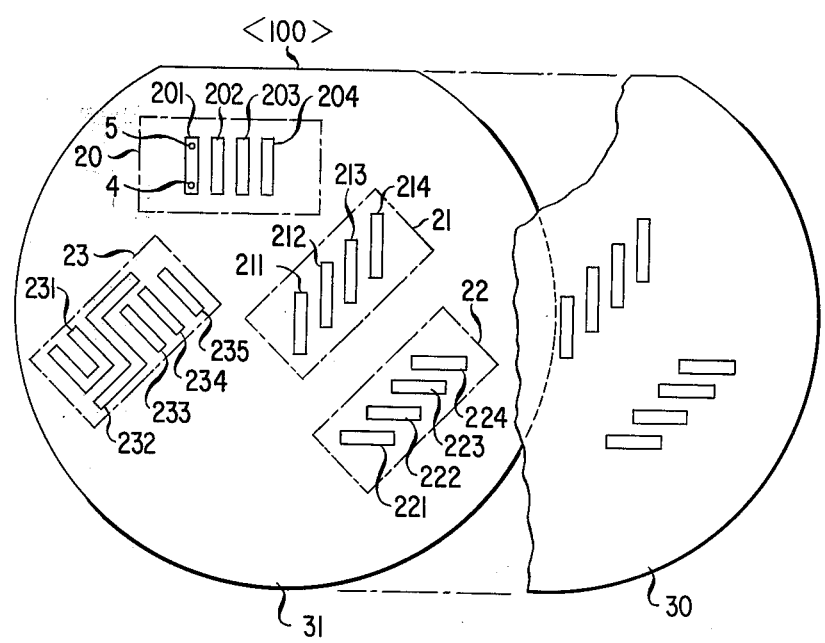
FIG. 2 shows a plan view of a semiconductor wafer with resistors, a portion of a fabrication mask and the relative crystallographic orientation of the resistors and the wafer.

FIG. 2 shows a plan view of a portion of a fabrication mask 30 and a semiconductor wafer 31 with planar resistors formed into a major surface. Such resistors can be formed by well-known masking and impurity introduction techniques. The openings of mask 30 are aligned to be parallel to a <100> crystallographic of semiconductor wafer 31 and above a location where a resistor is to be formed. A flat edge of the wafer indicates the relative crystallographic alignment of the wafer. In this illustrative example, the flat edge is parallel to a <100> direction. Typically, a plurality of integrated circuit chips are formed on such a wafer. As is known, this semiconductor wafer is most easily cleaved or broken apart along the <110> family of equivalent directions. Accordingly, the boundaries of the chips formed on the wafer are advantageously aligned along the <110> family of directions. Such a boundary is indicated as a broken line 23. It is common to orient any resistors formed within broken line 23 to make the most efficient use of the space enclosed by broken line 23. This may mean forming U-shaped resistors as resistor 231 or S-shaped resistors as resistor 232. Likewise, it may mean aligning closely spaced resistors with the boundary of the chip as shown by resistors 233, 234 and 235. The direction of current flow in the resistor is usually not a consideration. Often, as in this prior-art case, dominant current flow is parallel to the <110> boundaries of the chip.

To minimize the effects of stress in accordance with an embodiment of this invention, current flow, in this case, should either be perpendicular or parallel to the flat edge of the wafer. A grouping of resistors 201, 202, 203 and 204, enclosed within a broken line 20, is shown in FIG. 2. The resistors each have a longitudinal axis which is parallel to a <100> direction. Electrical contact to each resistor is made so a straight line between the contacts is approximately parallel to a <100> direction. This is indicated by contacts 4 and 5 to resistor 201. The boundary of a chip containing resistors 201-204 can be along broken line 20. Of course, such a chip can contain, in addition to resistors, other elements such as, for example, transistors. Further, a wafer can be used to produce a plurality of such chips.

However, since a semiconductor wafer is more easily cleaved or broken apart along the <110> family of equivalent directions, it is advantageous to choose chip boundaries so aligned. The boundaries of a chip in the <110> direction are shown as a broken line 21. Enclosed within broken line 21 are resistors 211, 212, 213 and 214. To maintain the desired orientation of the resistors within the chip, in accordance with an embodiment of this invention, the resistors are set at a 45 degree angle to the boundary of the chip. As before, a wafer can have a plurality of chips with boundaries oriented as broken line 21. A broken line 22 is also aligned with the <110> directions but contains an alternative arrangement of resistors. That is, resistors 221, 222, 223 and 224 are arranged parallel to a <100> direction and perpendicular to the resistors shown within broken line 21. Of course, any combination of resistor alignments shown within broken lines 21 and 22 can be used to obtain the same advantages.

It can be appreciated that to have generally parallel current flow within a resistor the shape of the resistor should be generally rectangular with contacts of limited size. It can further be appreciated that a slender resistor better controls the directionality of current than a broader resistor. Generally speaking, it is advantageous to have the length of the resistor exceed twice the width of the resistor. A circular resistor with one contact in the center and the other contact around the circumference of the circle would have current flowing in all radial directions. This would be undesirable.

It should be recognized that this invention can be applied to a vertical resistor. That is, the vertical direction of current flow in the vertical resistor should be aligned with a <100> direction. Such vertical current flow can be achieved by, say, having ohmic contacts on opposite sides of the wafer. However, vertical resistors are relatively less common than planar resistors.

It should also be recognized that this invention can be applied to non-rectangular resistive impurity zones such as U-shape, L-shaped and combinations thereof. That is, while the current changes in direction it still flows primarily in one of the family of <100> directions. In such impurity zones, it is advantageous that the resistivity at the angle where the current must change direction be low. For example, this can be accomplished by heavy doping at the angle or by a conductive metallization by-passing the angle.

Additionally, variation of resistance due to stress may be reduced by an increase of the total impurity concentration of a resistor. Total concentration can be increased by increasing the concentration of both donor type and acceptor type impurities.

Typically, the semiconductor wafer is n-type silicon having a concentration of about $10^{15}$ impurities per cubic centimeter. The resistors formed into the wafer are typically p-type conductivity and have an impurity concentration of, for example, about $10^{18}$ to $10^{20}$ impurities per cubic centimeter. It is often desirable to maintain a high resistivity while decreasing response of resistivity to stress. The factor relating the change in resistance to the strain is known as the gauge factor, $\sigma$. That is, $\Delta R/R = \sigma (\Delta l/l)$, where $\Delta R/R$ is the change in resistance and $\Delta l/l$ is the strain. To lower the magnitude of the gauge factor, both p-type and n-type impurity concentrations can be increased. Since the two types of impurity concentration compensate each other, the resistivity can remain high while change in resistance due to stress is decreased. It is believed that the mechanism for such a reduction in stress is either: (1) the mobility of the compensated resistor is markedly reduced by ionized impurity scattering and the relative changes in lattice mobility due to changes in the deformation potential will be less important, or (2) the formation of an impurity bond that is degenerate will cause the gauge factor to approach that of metal which is very small. The recognition of the desirability of increasing both donor and acceptor impurities to reduce the piezoresistance effect is considered to be part of this invention.

It has been found experimentally that choosing an appropriate combination of impurity compensation and crystallographic orientation can advantageously change the gauge factor. The gauge factor can be lowered and a sign reversal obtained. Since there can be a sign change, there is obviously a combination which gives "zero gauge". That is, strain would not cause any change in resistance. For example, under the conditions of current flow in a <100> direction and strains up to $10^{-2}$ applied in an orthogonal direction, the gauge factor decreased from +13 to −4 by using impurity compensation. Without impurity compensation, changing the current direction from a <110> direction to a <100> direction reduces the gauge factor from +80 to +13. The compensated resistors have a resistivity of about 500 ohms per square and contain a total impurity content about ten or twenty times greater than the difference between the donor and the acceptor concentration. For example, the p-type concentration can be about $10^{20}$ impurities per cubic centimeter and the n-type concentration about $9 \times 10^{19}$. The difference between the concentrations is $10^{19}$ and the sum of the concentrations is $19 \times 10^{19}$. Typically, the ratio of the concentrations is within the range 0.1 to 0.99 and the sum of the concentrations is at least about $10^{18}$ impurities per cubic centimeter. These complex transport properties are not completely understood but clearly show the additional reduction in piezoresistive sensitivity by doping selection. Various other modifications and variations will no doubt occur to those skilled in the various arts to which this invention pertains. All such variations which basically rely on the teachings through which this description has advanced the art are properly considered within the scope of this invention.

Mathematical Appendix

Resistivity of a cubic semiconductor like silicon is a scalar quantity, $\rho_0$. When the semiconductor is subjected to stress, resistivity becomes a tensor quantity of the second order, $(\rho_{ij})$, where $\rho_{ij}$ indicates the electric field in the direction of the $i$-th axis when unit current density flows in the direction of the $j$-th axis. For example, in the case of p-silicon the axes 1, 2 and 3 are taken to be the three cubic axes.

It is convenient to introduce a change-of-resistivity tensor, $(\Delta_{ij})$, defined by $$\Delta_{ij} = \rho_{ij}/\rho_0. \tag{1}$$

It should be noted the expressions $$\rho_{ij} = \rho_{ji}\ ;\ \Delta_{ij} = \Delta_{ji} \tag{2}$$

hold on thermodynamic grounds (Onsager's reciprocity theorem). As a result, the independent components of the change-of-resistivity tensor are $\Delta_{11}$, $\Delta_{22}$, $\Delta_{33}$, $\Delta_{23}$, $\Delta_{31}$, and $\Delta_{12}$. These six quantities are customarily written in a pseudo-vector form, as Eq. (3).

$$\Delta = \begin{bmatrix} \Delta_{11} \\ \Delta_{22} \\ \Delta_{33} \\ \Delta_{23} \\ \Delta_{31} \\ \Delta_{12} \end{bmatrix} \tag{3}$$

The tensor terms $\Delta_{11},...,\Delta_{12}$ are dependent on the strain components of the crystal, $e_{11}$, $e_{22}$, $e_{33}$, $e_{23}$, $e_{31}$ and $e_{12}$. The strain component, $e_{11}$ is the fractional deformation of the crystal in the direction of axis 1. The strain component $e_{23}$ is the cosine of the angle between the axis 2 and the axis 3. These six quantities are usually written as a pseudo-vector form as in Eq. (4).

$$e = \begin{bmatrix} e_{11} \\ e_{22} \\ e_{33} \\ e_{23} \\ e_{31} \\ e_{12} \end{bmatrix} \tag{4}$$

The relationship between $\Delta$ and $e$ in a cubic crystal like silicon is $$\begin{bmatrix} \Delta_{11} \\ \Delta_{22} \\ \Delta_{33} \\ \Delta_{23} \\ \Delta_{31} \\ \Delta_{12} \end{bmatrix} = \begin{bmatrix} m_{11} & m_{12} & m_{12} & 0 & 0 & 0 \\ m_{12} & m_{11} & m_{12} & 0 & 0 & 0 \\ m_{12} & m_{12} & m_{11} & 0 & 0 & 0 \\ 0 & 0 & 0 & m_{44} & 0 & 0 \\ 0 & 0 & 0 & 0 & m_{44} & 0 \\ 0 & 0 & 0 & 0 & 0 & m_{44} \end{bmatrix} \begin{bmatrix} e_{11} \\ e_{22} \\ e_{33} \\ e_{23} \\ e_{31} \\ e_{12} \end{bmatrix}. \tag{5}$$

Since $\Delta$'s and $e$'s are nondimensional quantities, $m_{ij}$'s are nondimensional. Charles Smith, in the previously cited work, determined the three independent quantities for p-silicon as $$m_{11}=11.2\ \ m_{12}=-3.4\ \ m_{44}=110.0. \tag{6}$$

It is worthwhile to point out that $m_{44}$ is about an order of magnitude larger than $m_{11}$ or $m_{12}$.

From equations (1)–(6) the stress-dependent resistance change of integrated circuit resistors can be derived. Let us consider the case where a thin plate of silicon with a (001) major surface is strained in a direction D (making angle $\Theta$ with a first cubic axis). By simple algebra, the strain components are given by $$\begin{aligned} e_{11} &= \alpha(\cos^2\theta - p\sin^2\theta) & e_{23} &= 0 \\ e_{22} &= \alpha(\sin^2\theta - p\cos^2\theta) & e_{31} &= 0 \\ e_{33} &= -\alpha p & e_{12} &= 2\alpha(1+p)\cos\theta\sin\theta \end{aligned} \tag{7}$$

where $\alpha$ is the strain, the D direction and p is the Poisson ratio.

The $\Delta$ matrix components are given by $$\Delta_{11} = \alpha\{m_{11}(\cos^2\theta - p\sin^2\theta) + m_{12}(\sin^2\theta - p\cos^2\theta - p)\}$$

$$\Delta_{22} = \alpha\{m_{11}(\sin^2\theta - p\cos^2\theta) + m_{12}(\cos^2\theta - p\sin^2\theta - p)\}$$

$$\Delta_{33} = \alpha\{m_{11}p + m_{12}(1-p)\}$$

$$\Delta_{12} = \alpha\, 2m_{44}(1+p)\cos\theta\sin\theta$$

$$\Delta_{23} = \Delta_{31} = 0. \tag{8}$$

Suppose that the current flow makes angle $\Phi$ with the first cubic axis. The resistance change in the direction of the current is then given by $$\Delta(\theta,\Phi) = \Delta_{11}\cos^2\Phi + \Delta_{22}\sin^2\Phi + 2\Delta_{12}\sin\Phi\cos\Phi. \tag{9}$$

Since the magnitude of $\Delta_{12}$ is about 10 times larger than the other matrix components, $$\Delta(\theta,\Phi) \cong 2\Delta_{12}\sin\Phi\cos\Phi = \alpha m_{44}(b\ 1+p)\sin 2\theta \sin 2\Phi. \tag{10}$$

For this dominant term to vanish, $\theta$ or $\Phi$ must be an integral multiple of $\pi/2$.

Depending on the direction of the stress three different cases exist:

1. For the best configuration $\sin 2\theta = 0$ and $\sin 2\Phi = 0$. Therefore small deviation of the stress direction will not induce large change in the resistance.
2. For the worst configuration, $\sin 2\theta = \sin 2\Phi = 1$, the largest resistance change occurs.
3. For the intermediate case either $\sin 2\theta = 0$ or $\sin 2\Phi = 0$ and the resistance change is small.

What is claimed is:

1. A semiconductor integrated circuit in a semiconductor body of a first conductivity type comprising
    an impurity zone of the second conductivity type in the semiconductor body for use as a resistor, and
    two ohmic contacts to the impurity zone so a line between the contacts stays within the boundaries of the impurity zone and is parallel to a <100> crystallographic direction of the semiconductor body, wherein the semiconductor is silicon, the first type conductivity is n-type and the second type conductivity is p-type, wherein a major surface of the silicon body is the (100) plane and the two ohmic contacts are on the (100) plane, wherein the impurity zone is generally rectangular and has a length greater than about two times the width, said circuit further comprising a plurality of impurity zones used as resistors wherein a majority of the impurity zones have two ohmic contacts to each impurity zone so a line between the contacts stays within the boundaries of the respective impurity zone and is parallel to a <100> crystallographic direction, wherein all of the impurity zones used as resistors have two ohmic contacts to each impurity zone so a line between the contacts stays within the boundaries of the respective impurity zone and is parallel to a <100> crystallographic direction, and wherein the impurity zone in the semiconductor body has a concentration of first type impurities less than the concentration of second type impurities, the ratio of concentrations being within the range of 0.1 to 0.99 and the sum of the concentrations being at least about $10^{18}$ impurities per cubic centimeter.

2. A semiconductor integrated circuit as recited in claim 1 wherein a boundary of the (100) plane is parallel to a <110> crystallographic direction.

3. A semiconductor integrated circuit in a semiconductor body of a first conductivity type comprising:

an impurity zone of a second conductivity type in the semiconductor body for use as a resistor wherein the impurity zone in the semiconductor body has a concentration of first type impurities less than the concentration of second type impurities, the ratio of concentrations being within the range of 0.1 to 0.99 and the sum of the concentrations being at least about $10^{18}$ impurities per cubic centimeter, and 2 ohmic contacts to the impurity zone so a line between the contacts stays within the boundaries of the impurity zone and is parallel to a <100> crystallographic direction of the semiconductor body.

4. A semiconductor integrated circuit in a semiconductor body as recited in claim 3 further comprising a plurality of impurity zones used as resistors wherein a majority of the impurity zones have 2 ohmic contacts to each impurity zone so a line between the contacts stays within the boundaries of the respective impurity zone and is parallel to a <100> crystallographic direction.

5. A semiconductor integrated circuit as recited in claim 4 wherein all of the impurity zones used as resistors have two ohmic contacts to each impurity zone so a line between the contacts stays within the boundaries of the respective impurity zone and is parallel to a <100> crystallographic direction.

6. A semiconductor integrated circuit as recited in claim 5 wherein a major surface of the semiconductor body is the (100) plane, the 2 ohmic contacts are on the (100) plane and a boundary of the semiconductor body is parallel to a <110> crystallographic direction.

7. A semiconductor integrated circuit in a semiconductor body of a first conductivity type comprising:

an impurity zone of the second conductivity type in the semiconductor body for use as a resistor, and 2 ohmic contacts to the impurity zone so a line between the contacts stays within the boundaries of the impurity zone and is parallel to a <100> crystallographic direction of the semiconductor body, wherein the impurity zone in the semiconductor body has a concentration of first type impurities less than the concentration of second type impurities, the ratio of concentrations being within the range of 0.1 to 0.99 and the sum of the concentrations being at least about $10^{18}$ impurities per cubic centimeter.

* * * * *